US012525578B2

(12) United States Patent
Chang et al.

(10) Patent No.: US 12,525,578 B2
(45) Date of Patent: Jan. 13, 2026

(54) THERMALLY-AWARE SEMICONDUCTOR PACKAGES

(71) Applicant: Taiwan Semiconductor Manufacturing Company, Ltd., Hsinchu (TW)

(72) Inventors: Fong-Yuan Chang, Hsinchu County (TW); Ching-Yi Lin, Zhubei (TW); Po-Hsiang Huang, Tainan (TW); Ho Che Yu, Zhubei (TW); Jyh Chwen Frank Lee, Palo Alto, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 799 days.

(21) Appl. No.: 17/827,287

(22) Filed: May 27, 2022

(65) Prior Publication Data
US 2023/0223379 A1 Jul. 13, 2023

Related U.S. Application Data

(60) Provisional application No. 63/298,899, filed on Jan. 12, 2022.

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3677* (2013.01); *H01L 23/5286* (2013.01);
(Continued)

(58) Field of Classification Search
CPC ............. H01L 25/0657; H01L 23/3677; H01L 23/5286; H01L 24/08
(Continued)

(56) References Cited

U.S. PATENT DOCUMENTS

2021/0225780 A1* 7/2021 Wu ............... H01L 21/563

FOREIGN PATENT DOCUMENTS

| CN | 107431064 A | 12/2017 |
| TW | 201143019 A | 12/2011 |
| TW | 202008526 A | 2/2020 |

OTHER PUBLICATIONS

Office Action issued in connection with Taiwan Appl. No. 112100573 dated Aug. 25, 2023.

* cited by examiner

*Primary Examiner* — Xia L Cross
(74) *Attorney, Agent, or Firm* — FOLEY & LARDNER LLP

(57) ABSTRACT

A semiconductor device includes a first substrate. The semiconductor device includes a plurality of metallization layers formed over the first substrate. The semiconductor device includes a plurality of via structures formed over the plurality of metallization layers. The semiconductor device includes a second substrate attached to the first substrate through the plurality of via structures. The semiconductor device includes a first conductive line disposed in a first one of the plurality of metallization layers. The first conductive line, extending along a first lateral direction, is connected to at least a first one of the plurality of via structures that is in electrical contact with a first through via structure of the second substrate, and to at least a second one of the plurality of via structures that is laterally offset from the first through via structure.

20 Claims, 11 Drawing Sheets

(51) Int. Cl.
*H01L 23/367* (2006.01)
*H01L 23/528* (2006.01)
*H01L 25/00* (2006.01)

(52) U.S. Cl.
CPC .............. *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01); *H01L 2225/06589* (2013.01)

(58) Field of Classification Search
USPC ......................................................... 257/777
See application file for complete search history.

THERMALLY-AWARE SEMICONDUCTOR PACKAGES

CROSS-REFERENCE TO RELATED APPLICATION

This application claims priority to and the benefit of U.S. Provisional Application No. 63/298,899, filed Jan. 12, 2022, entitled "THERMAL-AWARE PDN STRUCTURE," which is incorporated herein by reference in its entirety for all purposes.

BACKGROUND

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-nanometer node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
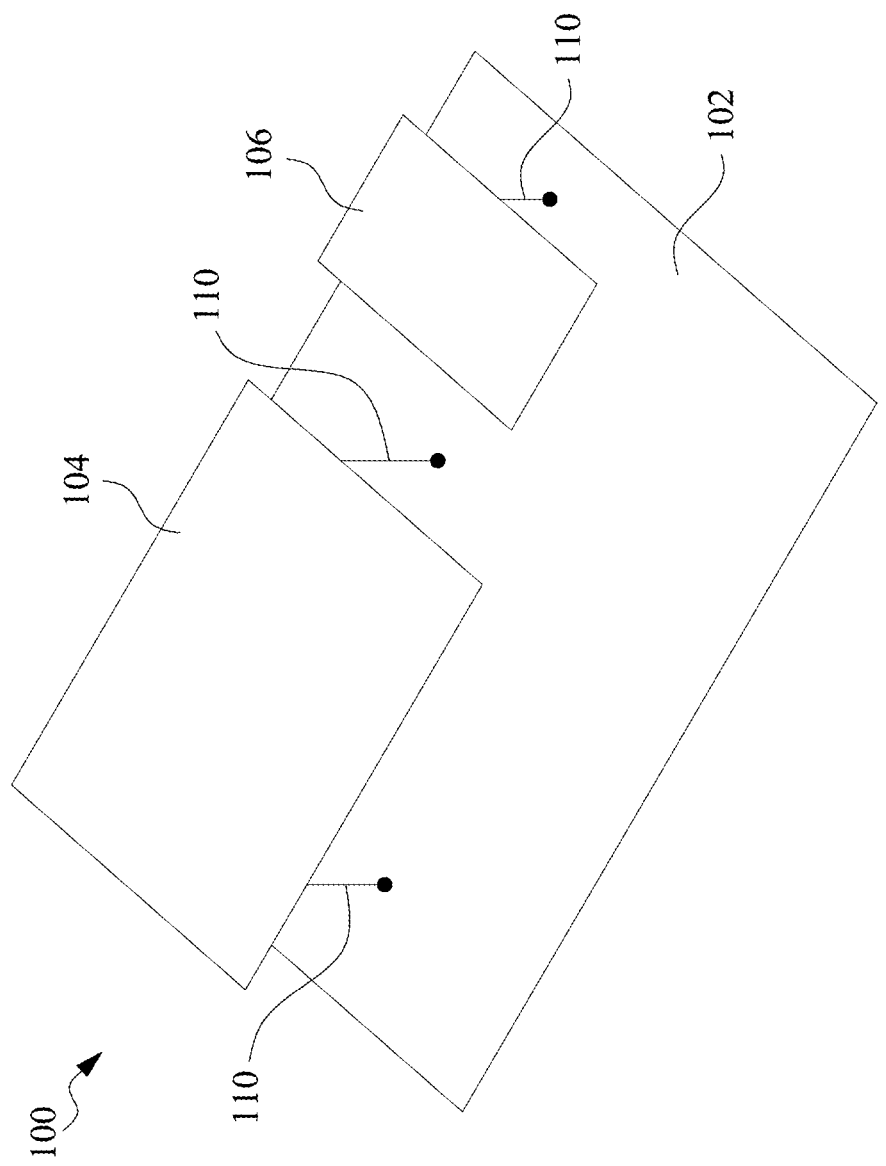
FIG. 1 illustrates a schematic diagram of a semiconductor package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor technologies further advance, packaged semiconductor devices, e.g., three-dimensional integrated circuits (3DICs), have emerged as an effective alternative to further reduce the physical size of semiconductor devices. In a packaged (e.g., stacked) semiconductor device, active circuits such as logic, memory, processor circuits, and the like are fabricated on different semiconductor wafers or dies. Two or more these semiconductor dies may be installed side-by-side or stacked on top of one another to further reduce the form factor of the semiconductor device.

In order to optimize (e.g., minimize) IR drop along a power distribution/deliver network (PDN), when two or more of such semiconductor dies are stacked on top of one another, corresponding PDN structures of at least one of the stacked semiconductor dies are disposed next to a (e.g., semiconductor) substrate of the other of the stacked semiconductor dies. In existing technologies, these PDN structures are connected to one or more through via structures through a number of via structures. As (e.g., electrical) performance of each of these stacked semiconductor dies may improve over time in accordance with increasingly advanced technology nodes and/or packaging techniques, their thermal performance may be disadvantageously compromised. For example, given the relatively tight space that each semiconductor die can occupy, the number of via structures interposed between the adjacent semiconductor dies is limited, which can in turn lower an effective thermal conductivity of the PDN structures. With such a lower thermal conductivity, inefficient heat dissipation (or propagation) of any of the stacked semiconductor dies may form a bottleneck for the overall performance of the stacked semiconductor dies. Thus, the existing semiconductor packages have not been entirely satisfactory in many aspects.

The present disclosure provides various embodiments of a semiconductor package including at least two semiconductor dies stacked on top of one another, and methods of forming the same. In various embodiments, PDN structures of at least one of the stacked semiconductor dies each have via structures connected thereto in addition to a relatively limited number of via structures connected to through via structures, and one or more conductive structures configured for landing of further additional via structures. For example, a PDN structure of the semiconductor die, as disclosed herein, may extend along a first lateral direction with a relatively long length, and the PDN structure can include or be connected to one or more relatively short conductive structures extending along the same first lateral direction. In this way, an overall thermal conductivity of the PDN structure can be significantly increased, for example, by including more thermal conductive materials. Such short conductive structures may allow additional via structures to land thereon, which can further increase the thermal conductivity of the PDN structure. Still further, in addition to the via structures (e.g., operatively) connected to the corresponding through via structures, the PDN structure can be connected to one or more additional via structures that are not necessarily connected to a through via structure. Even though such via structures may not be operatively configured (e.g., to deliver power) in certain scenarios, having these via structures connected to the PDN structure can yet further advantageously increase the thermal conductivity of the PDN structure.

FIG. 1 illustrates a schematic diagram of a semiconductor package 100 includes a number of semiconductor dies (or chips) 102, 104, and 106, in accordance with various embodiments. As shown, three semiconductor dies 102 to 106 are integrated with each other as a (e.g., three-dimensional (3D)) system package, e.g., a System on Integrated Chips (SoIC). However, it should be understood that the semiconductor package 100 can include any number of integrated semiconductor dies and those semiconductor dies can be integrated in any of various other arrangements, while remaining within the scope of present disclosure.

In various embodiments, each of the semiconductor dies 102 to 106 may be configured as a partitioned system (e.g., a System on Chip (SoC)) with a certain function. Further, through the use of various advanced interconnection technologies (e.g., 110 of FIG. 1), the semiconductor dies 102 to 106 can have respectively different chip sizes, respectively different functions, and/or be respectively fabricated with different technology nodes, which advantageously allows the semiconductor package 100 to have ultra-low link latency and ultra-low energy consumption. For example, the semiconductor die 102 may function as a logic system, while the semiconductor dies 104 and 106 may function as a memory system and a sensor system, respectively. In another example, the semiconductor die 102 may function as a logic system, while the semiconductor dies 104 and 106 may function as a first memory system and a second memory system, respectively.

Figure 2:
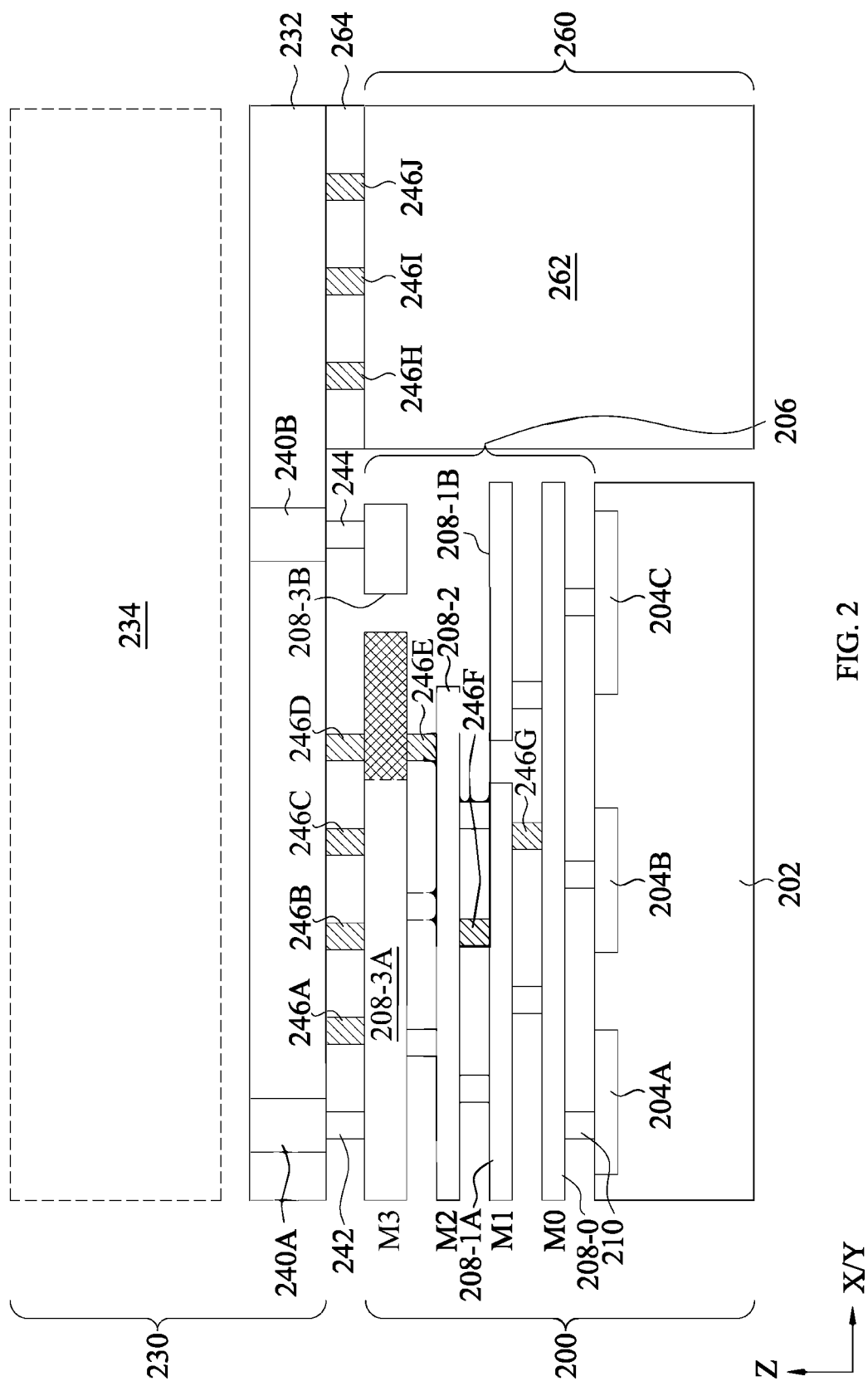
FIG. 2 illustrates a cross-sectional view of a portion of the semiconductor package of FIG. 1, in accordance with some embodiments.

FIG. 2 illustrates a cross-sectional view of a portion of the semiconductor package 100 shown in FIG. 1 (hereinafter "package 100A"), in accordance with various embodiments. It should be appreciated that the illustrative embodiment of FIG. 2 is merely an example, and is not intended to limit the scope of present disclosure. Hence, the illustrative embodiment of FIG. 2 can include various of other components (e.g., an interposer, a redistribution structure, one or more bumps, an underfill material, an encapsulant material, etc.), while remaining within the scope of present disclosure. As shown in the cross-sectional view of FIG. 2, the package 100A includes semiconductor dies 200, 230, and 260 each of which can be an implementation of any of the semiconductor dies 102 to 106.

The semiconductor die 200 includes a substrate 202, the active device features (e.g., transistors) of a number of cells (e.g., 204A, 204B, 204C) formed along a major surface of the substrate 202, and a number of interconnect structures 206 formed over the cells 204A-C. The cells 204A-C each include a group of transistors operatively coupled to each other (through a respective group of the interconnect structures 206) so as to provide a function (e.g., a Boolean logic function). The interconnect structures 206 can further include a number of conductive lines (or wires) 208-0, 208-1A, 208-1B, 208-2, 208-3A 208-3B, etc., which are sometimes collectively referred to as conductive lines 208. The conductive lines 208 can be disposed in a number of metallization layers (or levels), respectively, and the conductive lines 208 in different metallization layers can be coupled to each other through a corresponding one of a number of conductive vias 210. In some embodiments, the conductive lines 208 are each formed as a metal structure extending along a lateral direction (e.g., the X direction or the Y direction), and the conductive vias 210 are formed as a metal structure extending along a vertical direction (e.g., the Z direction).

As shown, the conductive lines 208 are disposed across four metallization layers, M0, M1, M2, and M3. However, it should be understood that the semiconductor die 200 can include any number of metallization layers formed above the device features, while remaining within the scope of present disclosure. In general, each of the cells 204A to 204C is in electrical contact with a respective number of the conductive lines 208 through a corresponding number of conductive vias 210, thereby enabling its respective function and further allowing different cells to be electrically coupled to each other. Further, each of the cells 204A to 204C can be in electrical contact with at least one of the conductive lines 208 that is configured to provide a power supply voltage. The power supply voltage (e.g., VDD, VSS, etc.) can power the corresponding cell. Such a conductive line is part of a power delivery/distribution network (PDN), and may be disposed in a topmost one of the metallization layers, in various embodiments. Hereinafter, a conductive line configured to provide a power supply voltage is sometimes referred to as a PDN line or PDN wire. For example in FIG. 2, the conductive line 208-3A is an implementation of the PDN line. As will be discussed in further detail below, the PDN line 208-3A can include multiple parallel segments/sections (the portion filled with a argyle pattern) connected thereto, according to various embodiments. Such segments may originally be configured as dummy conductive lines in the corresponding (e.g., the topmost) metallization layer, which are formed on account of fabrication yield (e.g., the yield of a corresponding polishing process). Stated another way, this dummy conductive line may not be configured to deliver power or even signal. In the topmost metallization layer, the semiconductor die 200 can further include a number of conductive lines configured to propagate signals within the same cell or across different cells, each of which is sometimes referred to as a signal line or signal wire. For example in FIG. 2, the conductive line 208-3B is an implementation of the signal line.

The semiconductor die 230 includes a substrate 232 and a number of corresponding components disposed above the substrate 232. Such components include cells and interconnect structures, which may be similar to the cells 204A-B and the interconnect structures 206 of the semiconductor die 200, respectively. For the sake of clarity, these components are collectively illustrated as block 234 in the example of FIG. 2, and repeated description will not be repeated. In various embodiments, the semiconductor die 230 is integrated (e.g., bonded) to the semiconductor die 200 through various bump structures or through a bumpless bond. The bonding may be hybrid bonding, fusion bonding, direct bonding, dielectric bonding, metal bonding, solder joints (e.g., microbumps), or the like. For example, the semiconductor dies 200 and 230 are face-to-face (F2F) bonded. In such embodiments, the block 234 may include a number of interconnect structures disposed above the substrate 232, and a number of cells further above the interconnect structures. In another example, the semiconductor dies 200 and 230 are face-to-back (F2B) bonded. In such embodiments, the block 234 may include a number of cells disposed above the substrate 232, and a number of interconnect structures further above the cells.

In various embodiments of present disclosure, the semiconductor die 230 may be bonded to the semiconductor die 200 through a number of interconnect structures. For example in FIG. 2, the semiconductor dies 200 and 230 are bonded to each other using a number of through silicon/substrate via (TSV) structures, 240A and 240B. Each of the TSV structures 240A-B extends through the substrate 232. The TSV structure 240A is connected to the power line 208-3A through a first bonding via 242, and the TSV structure 240B is connected to the signal line 208-3B through a second bonding via 244. The TSV structure 240A can couple the PDN line 208-3A of the semiconductor die 200 to one or more PDN lines of the semiconductor die 230, and the TSV structure 240B can couple the signal line 208-3B to one or more signal lines of the semiconductor die 230, in some embodiments. Further, the TSV structures 240A and 240B can couple the PDN line 208-3A and signal line 208-3B of the semiconductor die 200 to one or more conductive connectors formed on the other (e.g., opposite) side of the semiconductor die 230, respectively, in some embodiments. Such conductive connectors may be ball grid array (BGA) connectors, solder balls, metal pillars, controlled collapse chip connection (C4) bumps, micro bumps, electroless nickel-electroless palladium-immersion gold technique (ENEPIG) formed bumps, or the like.

Further, the package 100A can include a number of thermal bonding vias, e.g., 246A, 246B, 246C, and 246D, physically connected to the PDN line 208-3A, in accordance with various embodiments. Although four thermal bonding vias are illustrated, the package 100A can include any number of thermal bonding vias connected to the PDN line 208-3A, while remaining within the scope of present disclosure. The thermal bonding vias 246A-D may not electrically couple the PDN line 208-3A to other operative components (e.g., another PDN line). For example, none of the thermal bonding vias 246A-D is connected to any TSV structure of the semiconductor die 230 (or any TSV structure extending through the substrate 232) by being laterally offset from the TSV structure.

However, with those thermal bonding vias 246A-D physically (and thus thermally) connected to the PDN line 208-3A, the thermal conductivity of a heat propagation path, traveling through the PDN line 208-3A, can be significantly increased. Such a heat propagation path typically travels from at least one of the cells 204A-C (as a heat source), through some of the interconnect structures 206, the bonding via 242, and the thermal bonding vias 246A-D, and to the TSV structure 240A. With such an increased thermal conductivity, additional heat generated along the path may be more efficiently and quickly dissipated. Although not shown, it should be understood that the package 100A can include a (e.g., metal) bonding pad disposed between a lower surface of the substrate 232 and each of the bonding vias 242-244 and thermal bonding vias 246A-D, while remaining within the scope of present disclosure.

In addition to the thermal bonding vias 246A-D formed above the PDN line 208-3A, which is formed in the topmost metallization layer, the package 100A can include a number of additional thermal vias formed below the topmost metallization layer. For example in FIG. 2, the package 100A includes thermal vias, 246E, 246F, 246G, etc., each of which is in thermal coupling with the PDN line 208-3A and interposed between any adjacent ones of the metallization layers. For example, the thermal via 246E is interposed between (conductive lines of) the metallization layers M2 and M3; the thermal via 246F is interposed between (conductive lines of) the metallization layers M2 and M1; and thermal via 246G is interposed between (conductive lines of) the metallization layers M1 and M0. Different from the thermal bonding vias 246A-D, such thermal vias 246E-G may not be configured to bond one die to another die. In some embodiments, such thermal vias 246E-G may not be operatively connected to any of the cells 204A-C. For example, the thermal vias 246E-G may not be configured to deliver any power supply voltage or signal to the cells. However, coupling one or more of these thermal vias to the PDN line 208-3A, the thermal conductivity of the corresponding heat propagation path can be further increased.

Referring still to FIG. 2, the package 100A can further include one or more dummy semiconductor dies 260 bonded to the semiconductor die 230. The dummy semiconductor dies 260 include a substrate 262, and may not include any active device features formed over the substrate 262. Alternatively stated, the dummy semiconductor die 260 may not provide an active operational function to the package 100A. However, such dummy semiconductor die 260 may be formed in consideration of a fabrication yield for the whole package 100 (e.g., provision of mechanical support for other side-by-side disposed semiconductor dies), in some embodiments. The dummy semiconductor die 260 can be bonded to the semiconductor die 230 (e.g., the substrate 232 of the semiconductor die 230) through one or more (e.g., oxide) bonding layers 264. In various embodiments, the package 100A can include a number of bonding thermal vias 246H, 246I, and 246J extending through the bonding layers 264.

Figure 3:
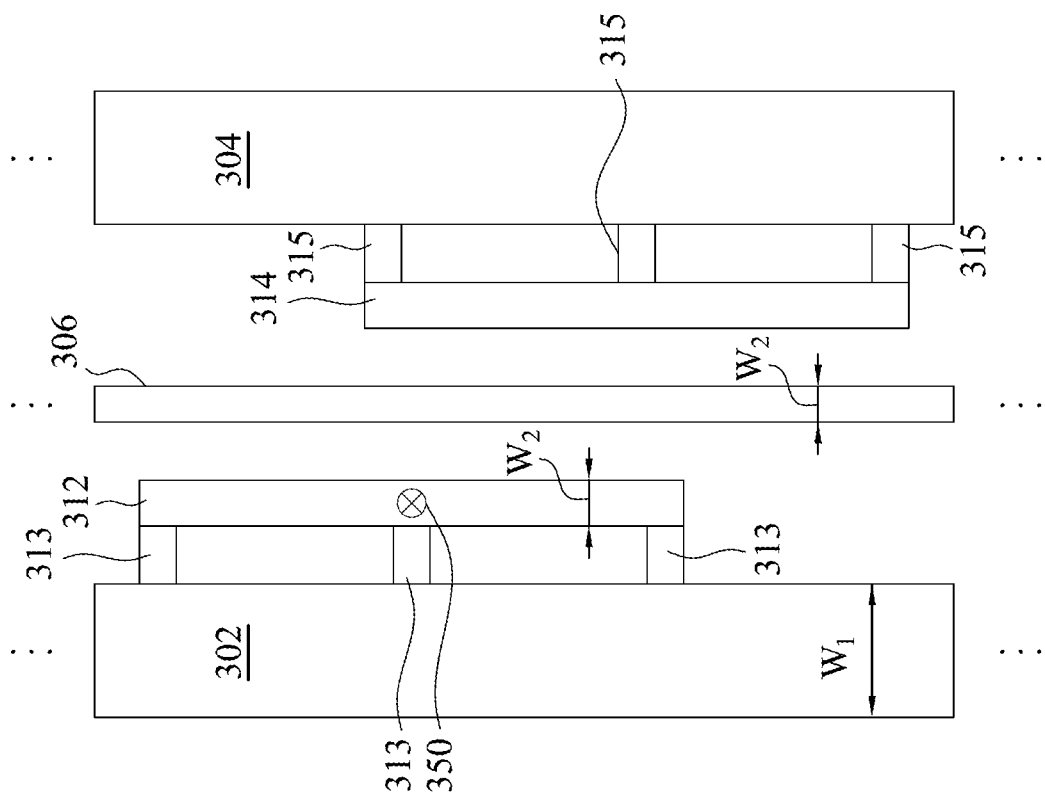
FIG. 3 illustrates a top view of one example arrangement of a number of PDN lines of the semiconductor package of FIG. 1, in accordance with some embodiments.
Figure 4:
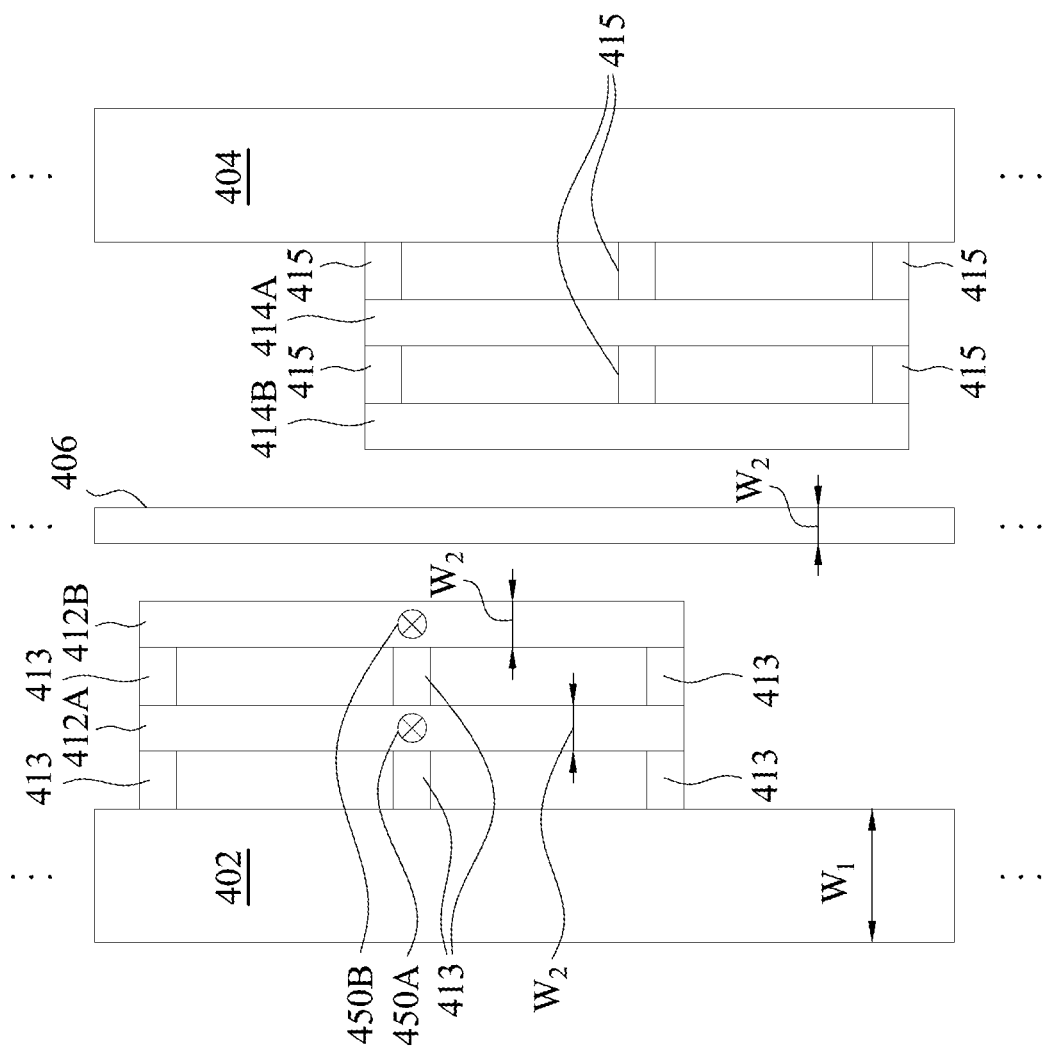
FIG. 4 illustrates a top view of another example arrangement of a number of PDN lines of the semiconductor package of FIG. 1, in accordance with some embodiments.
Figure 5:
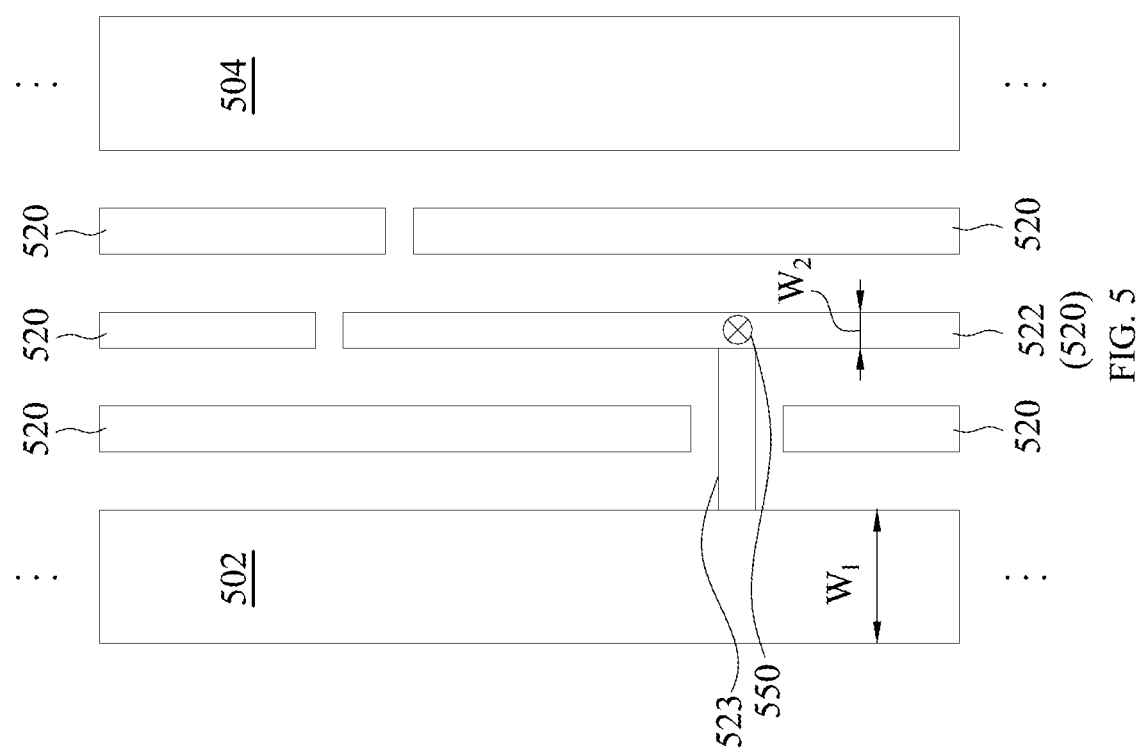
FIG. 5 illustrates a top view of yet another example arrangement of a number of PDN lines of the semiconductor package of FIG. 1, in accordance with some embodiments.

FIGS. 3, 4, and 5 illustrate respective top views of a number of example arrangements and profiles of the disclosed PDN lines (e.g., 208-3A of FIG. 2), in accordance with various embodiments. Although the following discussions will be focused on the PDN line typically formed in the topmost metallization layer of a semiconductor die, it should be understood that, according to various embodiments of present disclosure, the conductive line in any of other (e.g., lower) metallization layers that is part of a PDN (i.e., in electrical contact with a PDN line) can be implemented in the discussed arrangements and profiles.

Referring first to FIG. 3, a first PDN line 302 and a second PDN line 304 are depicted. The PDN lines 302 and 304 are in parallel with each other (i.e., extending along the same lateral direction). In some embodiments, the PDN lines 302 and 304 can deliver the same or respectively different power supply voltages. The PDN lines 302 and 304 are spaced from each other with a distance (sometimes referred to as a pitch), according to a corresponding technology node. As a non-limiting example, such a distance may be equal to about 5 micrometers (μm).

Between the PDN lines 302 and 304, a signal line 306 can be formed. The signal line 306 may be arranged in parallel with the PDN lines 302 and 304, but with a narrower width. For example in FIG. 3, the PDN lines 302 and 304 each have a width ($W_1$) and the signal line 306 has a width ($W_2$), where the width $W_1$ is substantially greater than the width $W_2$. According to various embodiments, between the signal line 306 and each of the PDN lines 302-304, each PDN line has at least one parallel segments connected thereto. For example, the PDN line 302 is connected to a segment 312 through a number of conductive lines 313, and the PDN line 304 is connected to a segment 314 through a number of conductive lines 315. The conductive lines 313 and 315 may each extend along another lateral direction perpendicular to a lengthwise direction of the PDN line. In various embodiments, such segments may originally be formed as dummy conductive lines in view of fabrication yield while forming the relatively narrow conductive lines (e.g., signal line 306). As such, the segments 312-314 may have a similar width to the signal line 306, i.e., the width $W_2$.

Referring next to FIG. 4, a first PDN line 402 and a second PDN line 404 are depicted. The PDN lines 402 and 404 are in parallel with each other (i.e., extending along the same lateral direction). In some embodiments, the PDN lines 402 and 404 can deliver the same or respectively different power supply voltages. The PDN lines 402 and 404 are spaced from each other with a distance (sometimes referred to as a pitch), according to a corresponding technology node. As a non-limiting example, such a distance may be equal to or greater than about 5 micrometers (μm).

Between the PDN lines 402 and 404, a signal line 406 can be formed. The signal line 406 may be arranged in parallel with the PDN lines 402 and 404, but with a narrower width. For example in FIG. 4, the PDN lines 402 and 404 each have a width ($W_1$) and the signal line 406 has a width ($W_2$), where the width $W_1$ is substantially greater than the width $W_2$. According to various embodiments, between the signal line 406 and each of the PDN lines 402-404, each PDN line has a plural number of parallel segments connected thereto. For example, the PDN line 402 is connected to segments 412A and 412B through a number of conductive lines 413, and the PDN line 404 is connected to segments 414A and 414B through a number of conductive lines 415. The conductive lines 413 and 415 may each extend along another lateral direction perpendicular to a lengthwise direction of the PDN line. In various embodiments, such segments may originally be formed as dummy conductive lines in view of fabrication yield while forming the relatively narrow conductive lines (e.g., signal line 406). As such, the segments 412A-B and 414A-B may have a similar width to the signal line 406, i.e., the width $W_2$.

Referring then to FIG. 5, a first PDN line 502 and a second PDN line 504 are depicted. The PDN lines 502 and 504 are in parallel with each other (i.e., extending along the same lateral direction). In some embodiments, the PDN lines 502 and 504 can deliver the same or respectively different power supply voltages. The PDN lines 502 and 504 are spaced from each other with a distance (sometimes referred to as a pitch), according to a corresponding technology node. As a non-limiting example, such a distance may be equal to or greater than about 5 micrometers (μm).

Between the PDN lines 502 and 504, there may be no signal line formed. Instead, a number of dummy conductive lines (or segments) 520 are interposed therebetween. The dummy conductive lines 520 may each be arranged in parallel with the PDN lines 502 and 504, but with a narrower width. For example in FIG. 5, the PDN lines 502 and 504 each have a width ($W_1$) and the dummy conductive lines 520 each have a width ($W_2$), where the width $W_1$ is substantially greater than the width $W_2$. According to various embodiments, at least one of the PDN lines 502-504 is connected to at least one of the dummy conductive lines 520. For example, the PDN line 502 is connected to segment 522 through a conductive line 523. The conductive line 523 may extend along another lateral direction perpendicular to a lengthwise direction of the PDN line.

In order to increase a thermal conductivity of each of the PDN lines 302, 304, 402, 404, 502, and 504 (and its corresponding heat propagation path), the segments 312, 314, 412A, 412B, 414A, 414B, and 522 are physically connected to the PDN lines, respectively. By having more metal material (which generally has a relatively high thermal conductivity when compared to a dielectric material surrounding the PDN lines) connected to each of the PDN lines, the thermal conductivity of each of the PDN lines can be significantly boosted. Further, those segments can be formed without violating any original design rules, as the segments have originally been configured to be formed to provide mechanical support for the relatively thin signal lines during a polishing (e.g., CMP) process. Consequently, the thermal performance of a semiconductor package including the disclosed PDN lines can be largely improved, while maintaining the original electrical performance.

With one or more segments (dummy conductive lines) connected to the PDN line, each PDN line has an increased amount of footprint to connect to one or more thermal vias, which can further increase a corresponding thermal conductivity. Referring again to FIGS. 3, 4, and 5, respectively, the segment 312 allows at least one thermal via 350 to be connected thereto; the segment 412A allows at least one thermal via 450A to be connected thereto; the segment 412B allows at least one thermal via 450B to be connected thereto; and the segment 522 allows at least one thermal via 550 to be connected thereto. In various embodiments, such thermal vias can be disposed above or below the PDN line. In an example where a thermal via is formed above the PDN line, this thermal via may also function as a thermal bonding via (e.g., similar to the vias 246A-D of FIG. 2). In another example where a thermal via is formed below the PDN line, this thermal via may be configured to connect to more lower (e.g., dummy) conductive lines (e.g., similar to the vias 246E-G of FIG. 2).

FIGS. 6, 7, 8, and 9 respectively illustrate cross-sectional views of a number of example semiconductor packages 600, 700, 800, and 900 including one or more of the disclosed thermal vias, in accordance with various embodiments. The semiconductor packages 600 to 900 each have a plural number of semiconductor dies integrated with each other in a manner substantially similar to the package 100A discussed with respect to FIG. 2 (e.g., an SoIC package). However, it should be understood that the disclosed thermal vias can be implemented in any of various packages (a Chip-on-Wafer-on-Substrate (CoWoS) package, an Integrated FanOut (InFo) package, etc.), while remaining within the scope of present disclosure.

Figure 6:
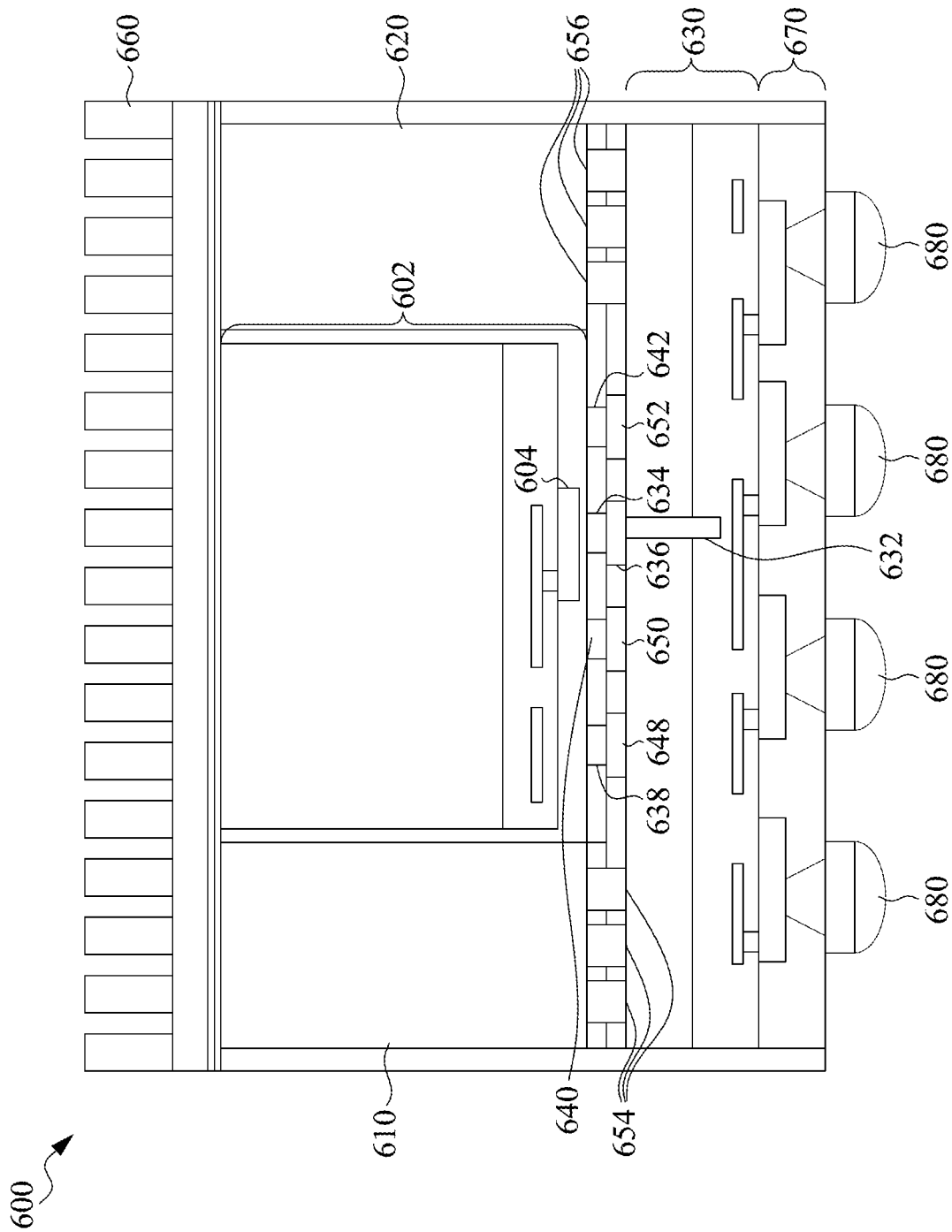
FIG. 6 illustrates a cross-sectional view of one example semiconductor package including a number of disclosed thermal bonding vias, in accordance with some embodiments.

In FIG. 6, the package 600 includes a first semiconductor die 602, a second semiconductor die 610, a third semiconductor die 620 bonded to a fourth semiconductor die 630. The semiconductor dies 610 and 620 may each function as a dummy semiconductor die, whereas the semiconductor dies 602 and 630 may each function as an active semiconductor die (e.g., a logic die, a memory die). The semiconductor die 602 has a PDN line 604 coupled to a TSV structure 632 extending through a substrate of the semiconductor die 630. The PDN line 604 is coupled to the TSV structure 632 through a bonding via 634 and a bonding pad 636. In various embodiments, the package 600 can further include a number of thermal bonding vias 638, 640, and 642 coupled to bonding pads 648, 650, and 652, respectively. Still further, the package 600 can include a number of thermal bonding vias 654 and 656 thermally bonding the dummy semiconductor dies 610 and 620 to the semiconductor die 630, respectively.

On the opposite side of the semiconductor dies 602, 610, and 620, the package 600 can include a heat sink 660 attached thereto. The heat sink can be configured to dissipate at least some of the heat generated during operation of the package 600. On the opposite side of the semiconductor die 630, the package 600 can optionally include a redistribution structure 670 configured to reroute or redistribute interconnect structures of the package 600. Such rerouted interconnect structures can be coupled to a number of conductive connectors 680 of the package 600.

Figure 7:
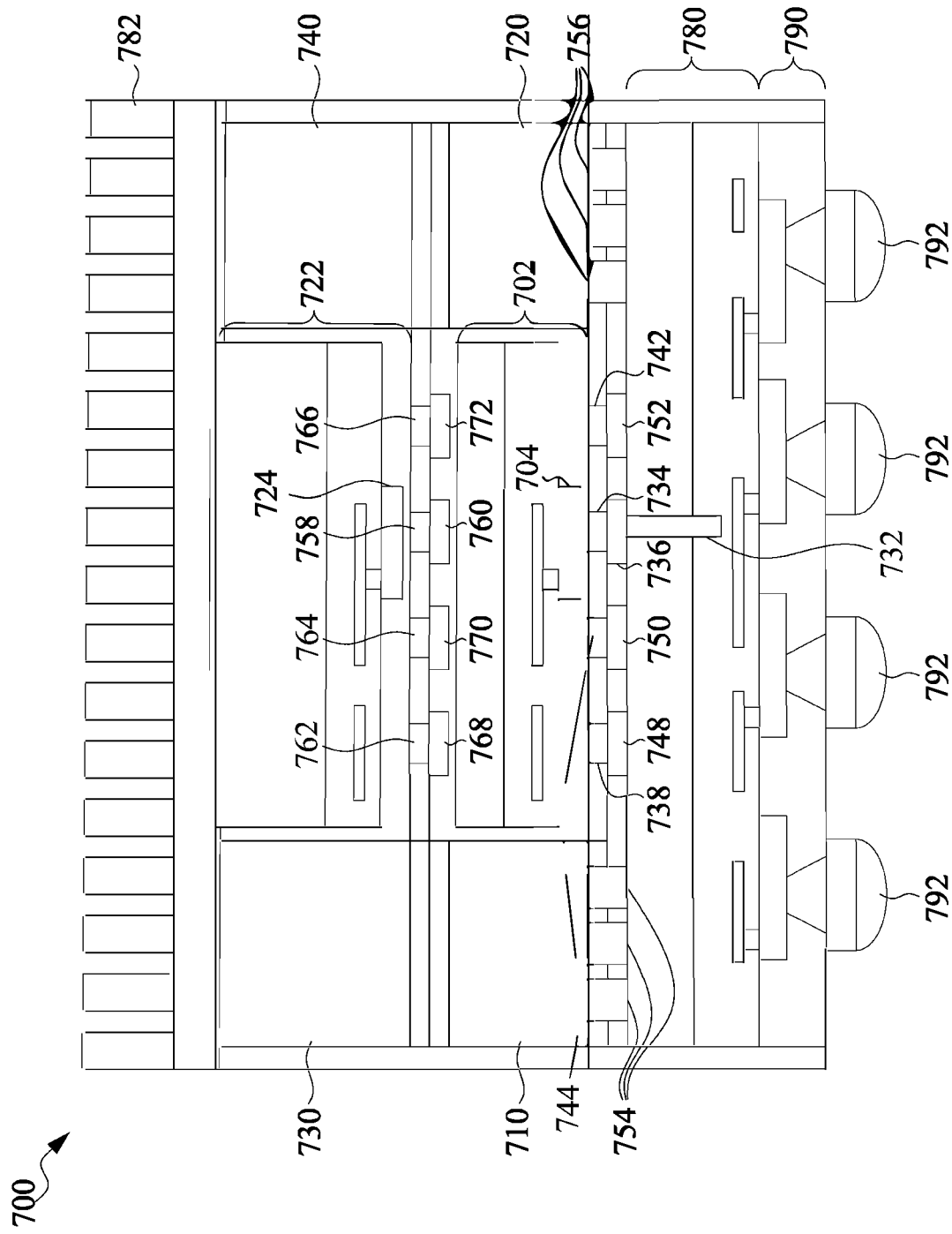
FIG. 7 illustrates a cross-sectional view of another example semiconductor package including a number of disclosed thermal bonding vias, in accordance with some embodiments.

In FIG. 7, the package 700 includes a first semiconductor die 702, a second semiconductor die 710, a third semiconductor die 720 bonded to a fourth semiconductor die 780. The package 700 further includes a fifth semiconductor die 722, a sixth semiconductor die 730, and a seventh semiconductor die 740 bonded to the semiconductor dies 702, 710, and 720, respectively. The semiconductor dies 710, 720, 730, and 740 may each function as a dummy semiconductor die, whereas the semiconductor dies 702, 722, and 780 may each function as an active semiconductor die (e.g., a logic die, a memory die). The semiconductor die 702 has a PDN line 704 coupled to a TSV structure 732 extending through a substrate of the semiconductor die 780. The PDN line 704 is coupled to the TSV structure 732 through a bonding via 734 and a bonding pad 736. In various embodiments, the package 700 can further include a number of thermal bonding vias 738, 742, and 744 coupled to bonding pads 748, 750, and 752, respectively. Still further, the package 700 can include a number of thermal bonding vias 754 and 756 thermally bonding the dummy semiconductor dies 710 and 720 to the semiconductor die 780, respectively. Similarly, the semiconductor die 722 has a PDN line 724 coupled to a bonding pad 760 (of the semiconductor die 702) through a bonding via 758. In various embodiments, the package 700 can further include a number of thermal bonding vias 762, 764, and 766 coupled to bonding pads 768, 770, and 772 (of the semiconductor die 702), respectively.

On the opposite side of the semiconductor dies 722, 730, and 740, the package 700 can include a heat sink 782 attached thereto. The heat sink can be configured to dissipate at least some of the heat generated during operation of the package 700. On the opposite side of the semiconductor die 780, the package 700 can optionally include a redistribution structure 790 configured to reroute or redistribute interconnect structures of the package 700. Such rerouted interconnect structures can be coupled to a number of conductive connectors 792 of the package 700.

Figure 8:
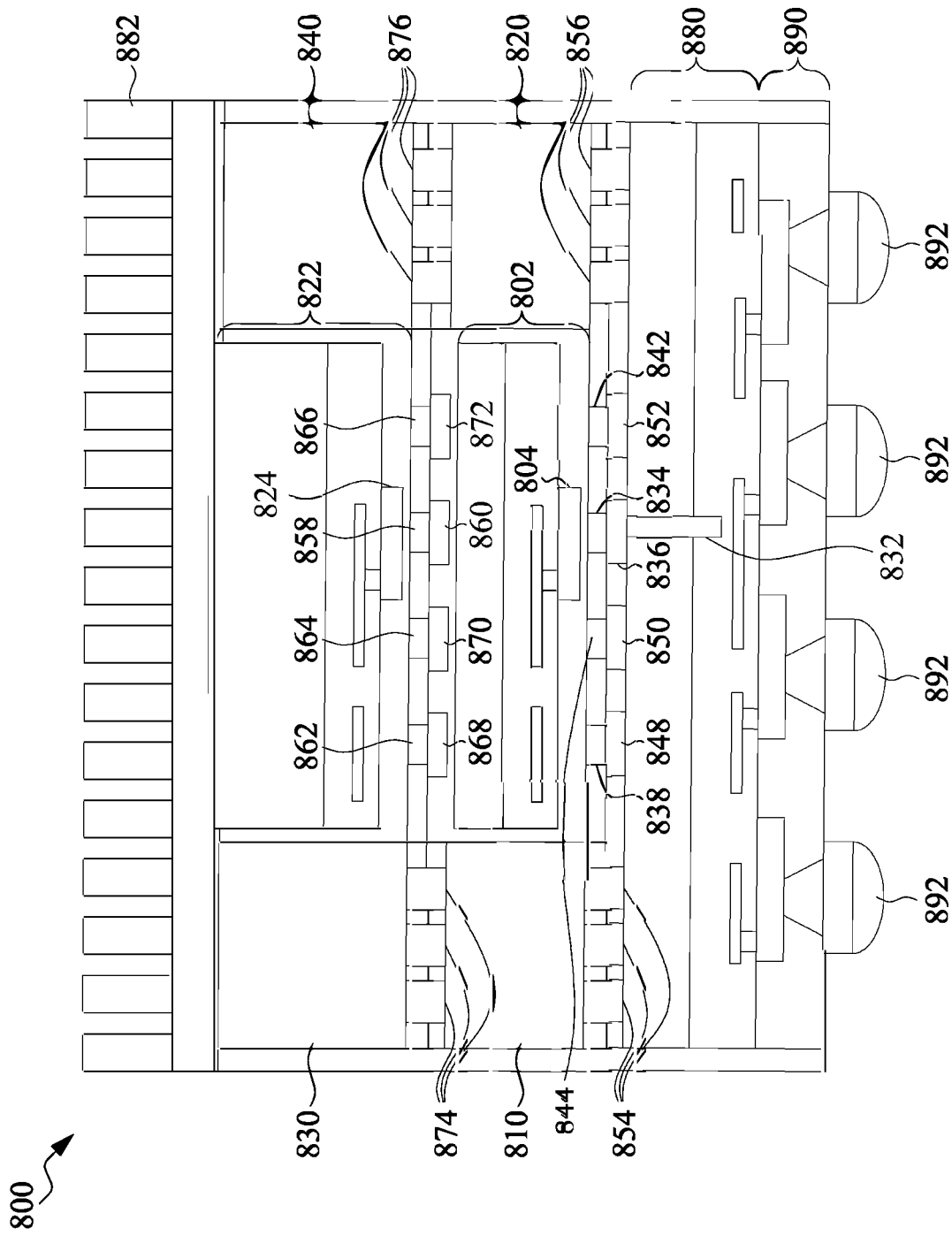
FIG. 8 illustrates a cross-sectional view of yet another example semiconductor package including a number of disclosed thermal bonding vias, in accordance with some embodiments.

In FIG. 8, the package 800 includes a first semiconductor die 802, a second semiconductor die 810, a third semiconductor die 820 bonded to a fourth semiconductor die 880. The package 800 further includes a fifth semiconductor die 822, a sixth semiconductor die 830, and a seventh semiconductor die 840 bonded to the semiconductor dies 802, 810, and 820, respectively. The semiconductor dies 810, 820, 830, and 840 may each function as a dummy semiconductor die, whereas the semiconductor dies 802, 822, and 880 may each function as an active semiconductor die (e.g., a logic die, a memory die). The semiconductor die 802 has a PDN line 804 coupled to a TSV structure 832 extending through a substrate of the semiconductor die 880. The PDN line 804 is coupled to the TSV structure 832 through a bonding via 834 and a bonding pad 836. In various embodiments, the package 800 can further include a number of thermal bonding vias 838, 842, and 844 coupled to bonding pads 848, 850, and 852, respectively. Still further, the package 800 can include a number of thermal bonding vias 854 and 856 thermally bonding the dummy semiconductor dies 810 and 820 to the semiconductor die 880, respectively. Similarly, the semiconductor die 822 has a PDN line 824 coupled to a bonding pad 860 (of the semiconductor die 802) through a bonding via 858. In various embodiments, the package 800 can further include a number of thermal bonding vias 862, 864, and 866 coupled to bonding pads 868, 870, and 872 (of the semiconductor die 802), respectively. The package 800 can include a number of thermal bonding vias 874 and 876 thermally bonding the dummy semiconductor dies 830 and 840 to the semiconductor dies 810 and 820, respectively.

On the opposite side of the semiconductor dies 822, 830, and 840, the package 800 can include a heat sink 882 attached thereto. The heat sink can be configured to dissipate at least some of the heat generated during operation of the package 800. On the opposite side of the semiconductor die 880, the package 800 can optionally include a redistribution structure 890 configured to reroute or redistribute interconnect structures of the package 800. Such rerouted interconnect structures can be coupled to a number of conductive connectors 892 of the package 800.

Figure 9:
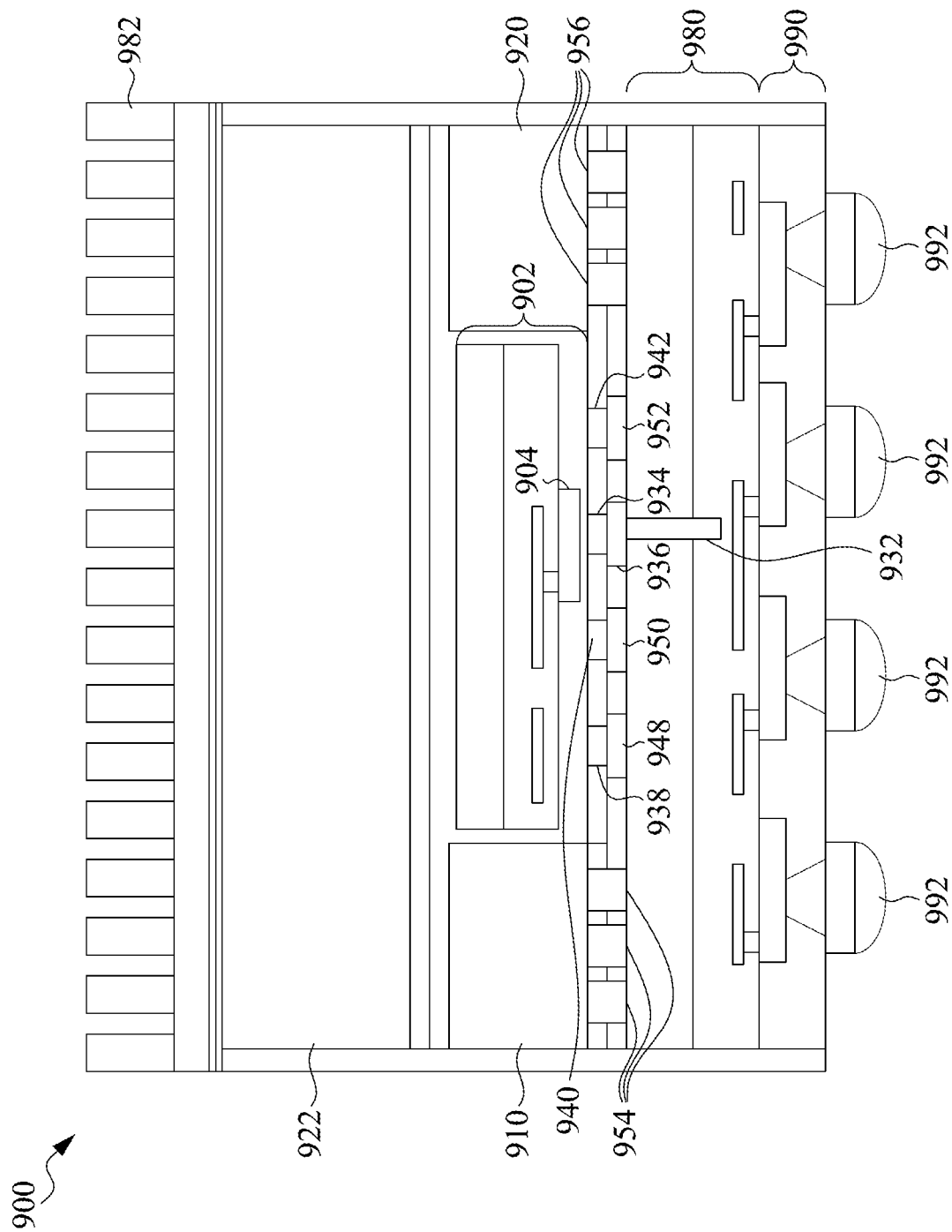
FIG. 9 illustrates a cross-sectional view of yet another example semiconductor package including a number of disclosed thermal bonding vias, in accordance with some embodiments.

In FIG. 9, the package 900 includes a first semiconductor die 902, a second semiconductor die 910, a third semiconductor die 920 bonded to a fourth semiconductor die 980. The package 900 further includes a fifth semiconductor die 922 bonded to the semiconductor dies 902, 910, and 920. The semiconductor dies 910, 920, and 922 may each function as a dummy semiconductor die, whereas the semiconductor dies 902 and 980 may each function as an active semiconductor die (e.g., a logic die, a memory die). The semiconductor die 902 has a PDN line 904 coupled to a TSV structure 932 extending through a substrate of the semiconductor die 980. The PDN line 904 is coupled to the TSV structure 932 through a bonding via 934 and a bonding pad 936. In various embodiments, the package 900 can further include a number of thermal bonding vias 938, 940, and 942 coupled to bonding pads 948, 950, and 952, respectively. Still further, the package 900 can include a number of thermal bonding vias 954 and 956 thermally bonding the dummy semiconductor dies 910 and 920 to the semiconductor die 980, respectively. On the opposite side of the semiconductor die 922, the package 900 can include a heat sink 982 attached thereto. The heat sink can be configured to dissipate at least some of the heat generated during operation of the package 900.

On the opposite side of the semiconductor die 980, the package 900 can optionally include a redistribution structure 990 configured to reroute or redistribute interconnect structures of the package 900. Such rerouted interconnect structures can be coupled to a number of conductive connectors 992 of the package 900.

Figure 10:
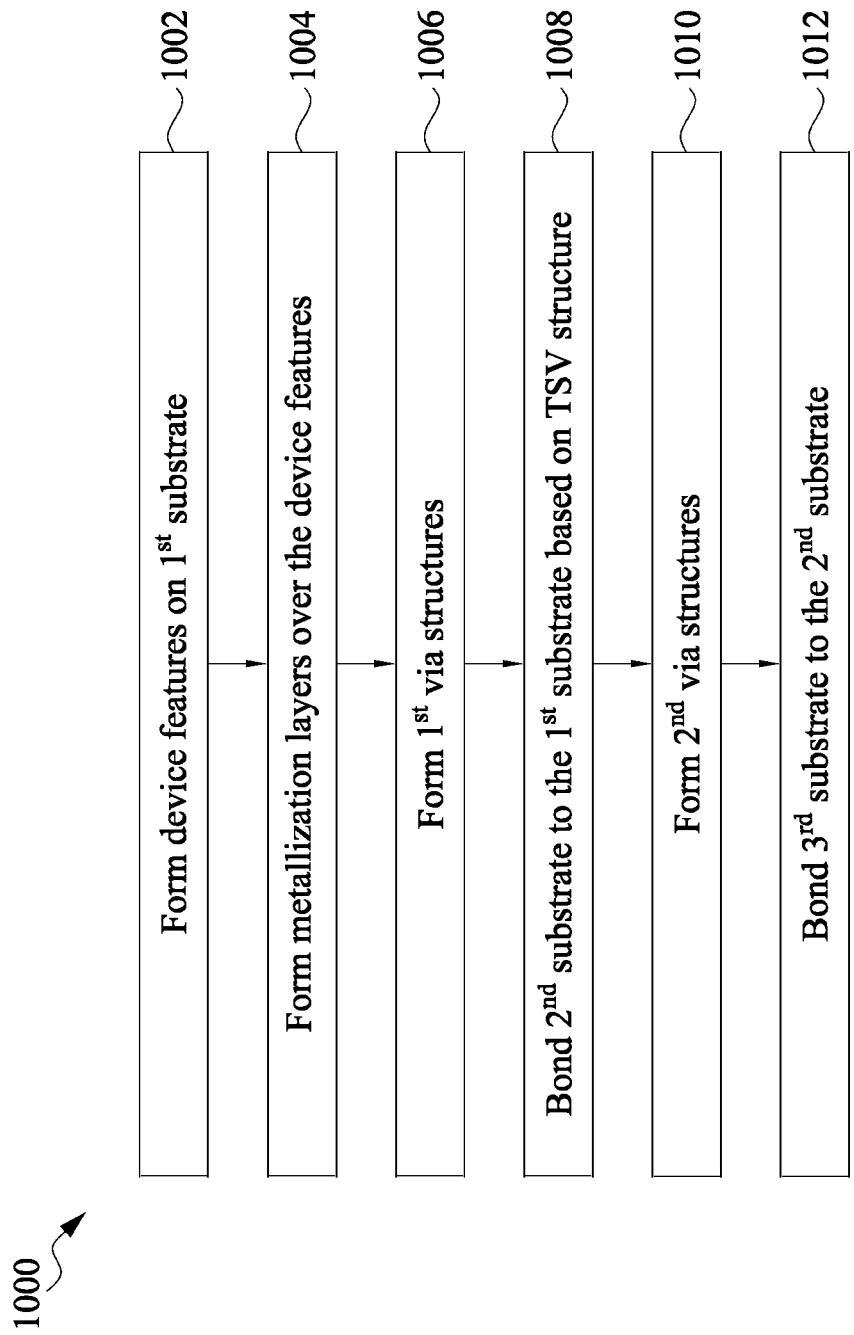
FIG. 10 illustrates a flow chart of an example method to make a semiconductor package, in accordance with some embodiments.

FIG. 10 illustrates a flow chart of an example method 1000 for forming at least a portion of a semiconductor package, in accordance with some embodiments. It should be noted that the method 1000 is merely an example, and is not intended to limit the present disclosure. Accordingly, it is understood that the order of operation of the method 1000 of FIG. 10 can change, that additional operations may be provided before, during, and after the method 1000 of FIG. 10, and that some other operations may be described briefly herein.

Such a semiconductor package, made by the method 1000, may include at least two semiconductor (e.g., electrical, photonic, or combination thereof) dies operatively and physically coupled (e.g., bonded) to each other. Further, the PDN line of at least one of the semiconductor dies is connected to one or more conductive segments (e.g., dummy conductive lines), and connected to one or more thermal bonding vias. For example, the semiconductor package may include a portion of the semiconductor packages 100, 600, 700, 800, and 900, as discussed above. Accordingly, operations of the method 1000 may sometimes be discussed in conjunction with the components discussed with respect to the figures above.

The method 1000 starts with operation 1002 of forming a number of device features on a first (e.g., silicon) substrate. The device features may partially form a number of cells (e.g., 204A-C of FIG. 2). Such cells are formed along a major surface of the first substrate (e.g., 202 of FIG. 2).

The method 1000 proceeds to operation 1004 of forming a number of metallization layers over the device features. The metallization layers (e.g., M0, M1, M2, M3 of FIG. 2) each include a number of conductive lines (e.g., 208 of FIG. 2), and the conductive lines of different metallization layers may be connected to each other through one or more vias (e.g., 210 of FIG. 2). In particular, in the topmost one of the metallization layers, at least one of the conductive lines can be configured as a PDN line (e.g., 208-3A of FIG. 2) to deliver a power supply voltage (e.g., VDD, VSS) to one or more of the corresponding cells. According to various embodiments, the PDN line is physically connected to a number of dummy conductive lines, each of which is in parallel with the PDN line. In some embodiments, the dummy conductive lines may be characterized with a width narrower than a width of the PDN line.

The method 1000 proceeds to operation 1006 of forming a number of first via structures. The first via structures (e.g., 242, 246A-D of FIG. 2) may be formed over the PDN line (e.g., above the topmost metallization layer). In various embodiments, the first via structures are in electrical contact with the PDN line. For example, some of the first via structures are connected to (and disposed above) the PDN line, and some of the first via structures are connected to (and disposed above) the connected dummy conductive line(s). Further, in various embodiments, at least one of the first via structures is in electrical contact with the through via structure of a to-be-bonded second (e.g., silicon) substrate, with remaining ones of the first via structures are in electrical isolation from the through via structure but in thermal contact with the second substrate.

The method 1000 proceeds to operation 1008 of bonding a second substrate to the first substrate based on a through via structure. For example in FIG. 2, the second substrate (e.g., 232 of FIG. 2) includes a number of through via structures, or TSVs, (e.g., 240A of FIG. 2) configured to allow the second substrate 232 to be bonded to the first substrate 202 through at least one of the first via structures (e.g., 242). Such a via structure 242 can electrically and physically bond the PDN line 208-3A formed over the first substrate to the TSV 240A extending through the second substrate 232. In various embodiments, the rest of the first via structures (e.g., 246A-D) may not be connected to the TSV 240A, but in thermal contact with the second substrate 232. As such, these first via structures 246A-D may help dissipate heat generated through the PDN line 208-3A.

The method 1000 proceeds to operation 1010 of forming a number of second via structures over a third (e.g., silicon) substrate. In some embodiments, the third substrate may have no active device features formed thereon, e.g., 262 of FIG. 2. In some embodiments, the second via structures (e.g., 246H-J of FIG. 2) are formed along a major surface of the third substrate 262, and are in thermal contact with the third substrate.

The method 1000 proceeds to operation 1012 of bonding the third substrate to the second substrate. In some embodiments, the third substrate 262 is bonded to the second substrate 232 through a bumpless bond, e.g., through one or more oxide layers with no bump structures interposed therebetween. However, when the second substrate 232 and third substrate 262 are bonded to each other, the second via structures 246H-J can thermally couple the third substrate 262 to the second substrate 232. As such, these second via structures 246H-J can help dissipate heat generated through the third substrate 262.

Figure 11:
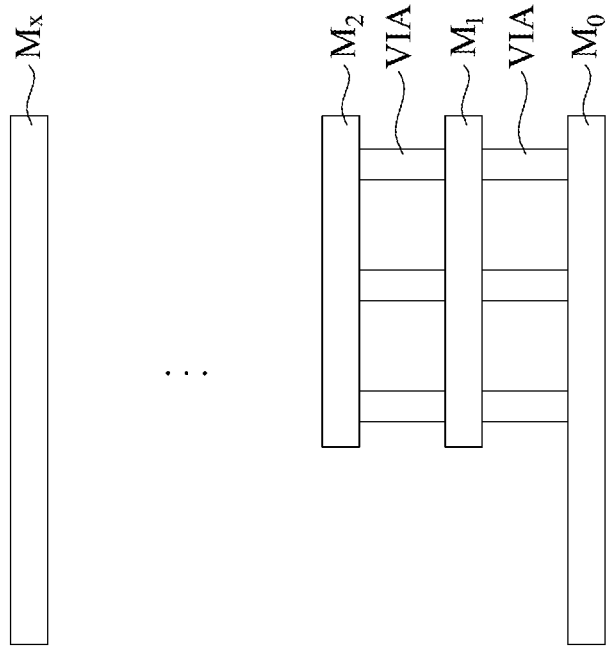
FIG. 11 illustrates a cross-sectional view of a portion of a semiconductor package that includes a number of metallization layers, in accordance with some embodiments.

FIG. 11 illustrates a cross-sectional view of a portion of a semiconductor package that includes a number of metallization layers, M0, M1, M2 . . . Mx, and a number of vias, VIA, formed between the adjacent metallization layers, in accordance with some embodiments. The metallization layers M0 to Mx may be vertically arranged on top of one another, with the metallization layers M0 and Mx disposed as the bottommost and topmost metallization layers, respectively. Each metallization layer has at least one conductive line, which is hereinafter referred to as conductive line, M0, M1, M2 . . . Mx. In some embodiments, these conductive lines may each be configured to deliver a power supply voltage to one or more corresponding cells, e.g., formed below the bottommost metallization layer M0.

Figure 12:
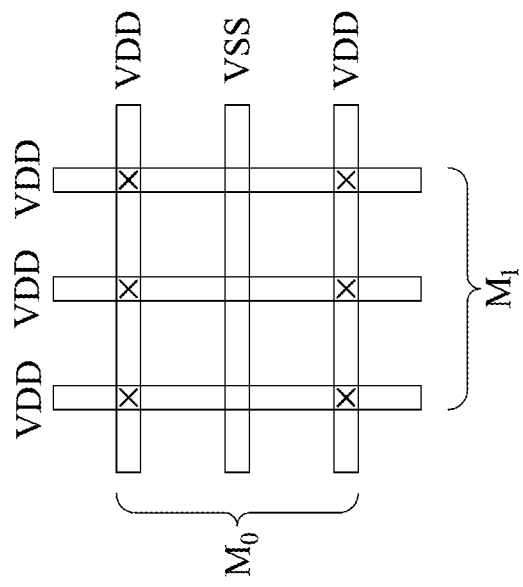
FIG. 12 illustrates a top view of a first pair of adjacent metallization layers of the semiconductor package of FIG. 11, in accordance with some embodiments.
Figure 13:
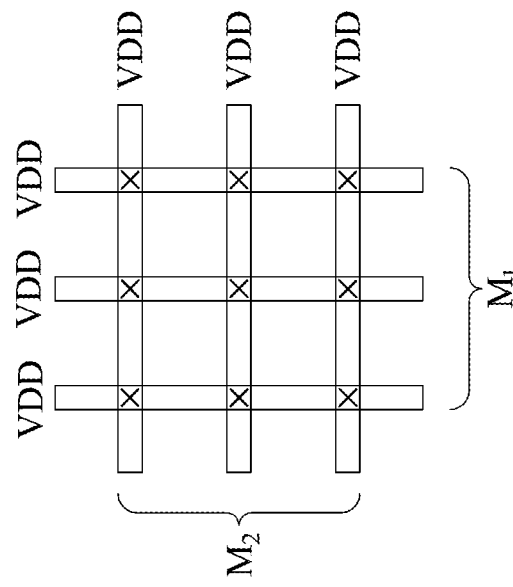
FIG. 13 illustrates a top view of a second pair of adjacent metallization layers of the semiconductor package of FIG. 11, in accordance with some embodiments.

FIGS. 12 and 13 illustrate top views of two adjacent pairs of the conductive lines, respectively. For example, FIG. 12 illustrates a top view of conductive lines M0 and M1, and FIG. 13 illustrates a top view of conductive lines M1 and M2. As shown, the conductive lines M0 may extend along a first lateral direction, the conductive lines M1 (disposed above the conductive lines M0) may extend along a second lateral direction perpendicular to the first lateral direction, and the conductive lines M2 (disposed above the conductive lines M1) may extend along the first lateral direction, thereby forming a mesh.

Referring first to FIG. 12, some of the conductive lines M0 are configured to deliver a first supply voltage, e.g., VDD (hereinafter VDD M0's). By forming a number of vias (labeled with "x") equally spaced apart along each of the VDD M0's with a smaller pitch, at least a total of six vias can be formed on the VDD M0's, which allows three conductive lines that also carry VDD to be formed (hereinafter VDD M1's). For example, an additional VDD M1 can be formed between a pair of adjacent VDD M1's. Referring next to FIG. 13, with a number of vias (labeled with "x")

equally spaced apart along each of the VDD M1's with a smaller pitch, at least a total of nine vias can be formed on the VDD M1's, which allows three conductive lines that also carry VDD to be formed (hereinafter VDD M2's). It should be understood that the same configuration of the conductive lines can be utilized to carry other power supply voltages, e.g., VSS. As such, a mesh of conductive lines that carries a certain power supply voltage can be formed in a relatively tight area, while maintaining a high number of vias connected therebetween.

In one aspect of the present disclosure, a semiconductor device is disclosed. The semiconductor device includes a first substrate. The semiconductor device includes a plurality of metallization layers formed over the first substrate. The semiconductor device includes a plurality of via structures formed over the plurality of metallization layers. The semiconductor device includes a second substrate attached to the first substrate through the plurality of via structures. The semiconductor device includes a first conductive line disposed in a first one of the plurality of metallization layers. The first conductive line, extending along a first lateral direction, is connected to at least a first one of the plurality of via structures that is in electrical contact with a first through via structure of the second substrate, and to at least a second one of the plurality of via structures that is laterally offset from the first through via structure.

In another aspect of the present disclosure, a semiconductor package is disclosed. The semiconductor package includes a first substrate. The semiconductor package includes a plurality of device features formed along a major surface of the first silicon substrate. The semiconductor package includes a plurality of metallization layers formed over the plurality of device features. The semiconductor package includes a second substrate to which the first substrate is bonded. The semiconductor package includes a plurality of through via structures extending through the second substrate. The semiconductor package includes a plurality of first via structures disposed between the plurality of metallization layers and the second substrate. The semiconductor package includes a first conductive line disposed in a topmost one of the plurality of metallization layers, wherein the first conductive line is configured as a part of a power delivery network for the plurality of device features. The first conductive line is in thermal contact with the second substrate through the plurality of first via structures. At least a first subset of the plurality of first via structures are each in electrical contact with a corresponding one of the plurality of through via structures, and at least a second subset of the plurality of first via structures are each in electrical isolation from the through via structures.

In yet another aspect of the present disclosure, a method for fabricating semiconductor devices is disclosed. The method includes forming a plurality of device features along a major surface of a first silicon substrate. The method includes forming a plurality of metallization layers formed over the plurality of device features. At least a first conductive line, disposed in a topmost one of the plurality of metallization layers, is configured to deliver a power supply voltage. The method includes forming a plurality of first via structures in electrical contact with the first conductive line. The method includes bonding the first silicon substrate to a second silicon substrate. The second silicon substrate has a through via structure extending through the second silicon substrate. At least one of the plurality of first via structures is in electrical contact with the through via structure, with remaining ones of the plurality of first via structures are in electrical isolation from the through via structure but in thermal contact with the second silicon substrate.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first substrate;
   a plurality of metallization layers formed over the first substrate;
   a plurality of via structures formed over the plurality of metallization layers;
   a second substrate attached to the first substrate through the plurality of via structures; and
   a first conductive line disposed in a first one of the plurality of metallization layers;
   wherein the first conductive line, extending along a first lateral direction, is connected to at least a first one of the plurality of via structures that is in electrical contact with a first through via structure of the second substrate, and to at least a second one of the plurality of via structures that is laterally offset from the first through via structure; wherein the first conductive line includes a main portion extending along the first lateral direction and a plurality of branch portions extending from the main portion in a second lateral direction perpendicular to the first lateral direction.

2. The semiconductor device of claim 1, wherein the first conductive line is configured to deliver a power supply voltage.

3. The semiconductor device of claim 1, wherein the second via structure is electrically isolated from any through via structure of the second substrate.

4. The semiconductor device of claim 1, further comprising:
   a second conductive line disposed in the first metallization layer and extends along the first lateral direction; and
   a third conductive line disposed in the first metallization layer and extends along a second lateral direction perpendicular to the first lateral direction, the third conductive line being connected to the second conductive line;
   wherein the first conductive line has a first length in the first lateral direction, and the second conductive line has a second length in the first lateral direction that is substantially shorter than the first length.

5. The semiconductor device of claim 4, wherein the first conductive line has a first width in the second lateral direction and the second conductive line has a second width in the second lateral direction, and wherein the first width is substantially greater than the second width.

6. The semiconductor device of claim 1, further comprising:
- a fourth conductive line disposed in the first metallization layer and extends along the first lateral direction;
- a fifth conductive line disposed in the first metallization layer and extends along the first lateral direction; and
- a sixth conductive line disposed in the first metallization layer and extends along a second lateral direction perpendicular to the first lateral direction, the sixth conductive line being connected to the fourth and fifth conductive lines;
- wherein the first conductive line has a first length in the first lateral direction, and the fifth and sixth conductive lines each have a second length in the first lateral direction that is substantially shorter than the first length.

7. The semiconductor device of claim 1, further comprising:
- a seventh conductive line disposed in the first metallization layer and extends along the first lateral direction;
- wherein the first and seventh conductive lines have a same length in the first lateral direction.

8. The semiconductor device of claim 7, wherein the first conductive line is spaced apart from the seventh conductive line along the second lateral direction, and wherein the first conductive line is configured to deliver a first supply voltage and the seventh conductive line is configured to deliver a second supply voltage.

9. The semiconductor device of claim 8, wherein the first supply voltage is VDD and the second supply voltage is VSS.

10. A semiconductor package, comprising:
- a first silicon substrate;
- a plurality of device features formed along a major surface of the first silicon substrate;
- a plurality of metallization layers formed over the plurality of device features;
- a second silicon substrate to which the first silicon substrate is bonded;
- a plurality of through via structures extending through the second silicon substrate;
- a plurality of first via structures disposed between the plurality of first metallization layers and the second silicon substrate; and
- a first conductive line disposed in a topmost one of the plurality of metallization layers, wherein the first conductive line is configured as a part of a power delivery network for the plurality of device features;
- wherein the first conductive line is in thermal contact with the second silicon substrate through plurality of first via structures; and
- wherein at least a first subset of the plurality of first via structures are each in electrical contact with a corresponding one of the through via structures, and at least a second subset of the plurality of first via structures are each in electrical isolation from the through via structures; wherein the first conductive line includes a main portion extending along a first lateral direction and a plurality of branch portions extending from the main portion in a second lateral direction perpendicular to the first lateral direction.

11. The semiconductor package of claim 10, wherein the first conductive line is further in thermal contact with the second silicon substrate.

12. The semiconductor package of claim 10, further comprising a second conductive line, disposed in the topmost metallization layer, that is also a part of the power delivery network.

13. The semiconductor package of claim 12, wherein the first conductive line is configured to deliver a first power supply voltage and the second conductive line is configured to deliver a second power supply voltage, and wherein the first and second conductive lines are disposed in parallel with each other.

14. The semiconductor package of claim 13, further comprising a plurality of third conductive lines that are each disposed in parallel with the first and second conductive lines, and interposed between the first and second conductive lines.

15. The semiconductor package of claim 14, further comprising a plurality of fourth conductive lines that are each disposed perpendicularly to the first and second conductive lines, and connected to one of the first or second conductive line.

16. The semiconductor package of claim 10, further comprising:
- a third silicon substrate also bonded to the second silicon substrate, wherein the third silicon substrate is laterally spaced from the first silicon substrate and has no device features formed along a major surface of the third silicon substrate; and
- a plurality of second via structures disposed between the third silicon substrate and the second silicon substrate, wherein the third silicon substrate is in thermal contact with the second silicon substrate through the plurality of second via structures.

17. The semiconductor package of claim 10, wherein the plurality of branch portions are configured to land additional via structures thereon to increase thermal conductivity of the first conductive line.

18. The semiconductor package of claim 10, wherein the first conductive line has a first width in the first lateral direction and the branch portions each have a second width in the first lateral direction, wherein the first width is substantially greater than the second width.

19. The semiconductor package of claim 10, wherein the branch portions were originally configured as dummy conductive lines formed for fabrication yield of the semiconductor package.

20. The semiconductor package of claim 10, wherein the plurality of first via structures includes thermal vias disposed below the first conductive line and interposed between adjacent metallization layers of the plurality of metallization layers.

* * * * *